(12) United States Patent
Huang et al.

(10) Patent No.: US 12,261,092 B2
(45) Date of Patent: Mar. 25, 2025

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Tzu-Sung Huang, Tainan (TW); Ming-Hung Tseng, Miaoli County (TW); Yen-Liang Lin, Taichung (TW); Ban-Li Wu, Hsinchu (TW); Hsiu-Jen Lin, Hsinchu County (TW); Teng-Yuan Lo, Hsinchu (TW); Hao-Yi Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 241 days.

(21) Appl. No.: 17/460,346

(22) Filed: Aug. 30, 2021

(65) Prior Publication Data
US 2023/0066968 A1 Mar. 2, 2023

(51) Int. Cl.
*H01L 23/31* (2006.01)
*H01L 21/56* (2006.01)
*H01L 23/367* (2006.01)
*H01L 23/498* (2006.01)

(52) U.S. Cl.
CPC ........ *H01L 23/3128* (2013.01); *H01L 21/561* (2013.01); *H01L 21/568* (2013.01); *H01L 23/367* (2013.01); *H01L 23/49822* (2013.01)

(58) Field of Classification Search
None
See application file for complete search history.

(56) References Cited

U.S. PATENT DOCUMENTS

| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 * | 10/2016 | Tsai ................. H01L 21/6835 |
| 9,496,189 | B2 | 11/2016 | Yu et al. |
| 9,666,502 | B2 | 5/2017 | Chen et al. |
| 9,735,131 | B2 | 8/2017 | Su et al. |
| 2019/0006200 | A1 * | 1/2019 | Lin ................. H01L 25/50 |
| 2019/0096817 | A1 * | 3/2019 | Yu ................. H01L 23/3128 |
| 2020/0135670 | A1 * | 4/2020 | Hsu ................. H01L 24/20 |
| 2020/0243497 | A1 * | 7/2020 | Hsu ................. H01L 23/36 |
| 2021/0020605 | A1 * | 1/2021 | Hiner ................. H01L 24/96 |

* cited by examiner

*Primary Examiner* — Jay C Chang
(74) *Attorney, Agent, or Firm* — JCIPRNET

(57) ABSTRACT

A semiconductor package includes a semiconductor device, an encapsulating material, a redistribution structure, and an adhesive residue. The encapsulating material encapsulates a first part of a side surface of the semiconductor device. The redistribution structure is disposed over the semiconductor device and a first side of the encapsulating material. The adhesive residue is disposed over a second side of the encapsulating material opposite to the first side and surrounding the semiconductor device, wherein the adhesive residue encapsulates a second part of the side surface of the semiconductor device.

20 Claims, 15 Drawing Sheets

SEMICONDUCTOR PACKAGE AND MANUFACTURING METHOD THEREOF

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
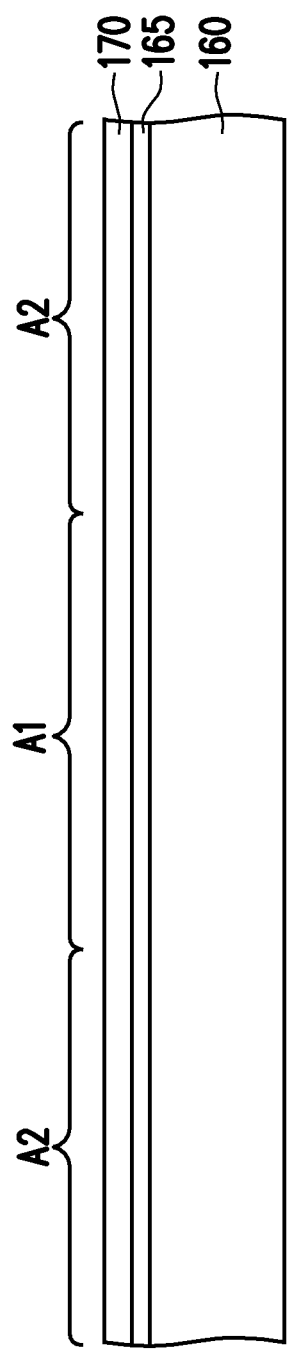
FIG. 1 to FIG. 10 illustrate partial cross sectional views of intermediate stages in the manufacturing of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package and the method of forming the same are provided in accordance with various exemplary embodiments. Before addressing the illustrated embodiments specifically, certain advantageous features and aspects of the present disclosed embodiments will be addressed generally. The semiconductor package may be adopted for improving die crack and/or delamination issues during testing. Described below is a structure having a continuous surface of an adhesive residue for filling and connecting the discontinuous surface between a back surface of a semiconductor device and an encapsulating material, which may avoid or reduce die crack and/or delamination issues at die edges. In addition, the manufacturing process can be simplified and production cost can be reduced. The intermediate stages of forming the package are illustrated in accordance with some embodiments. Some variations of some embodiments are discussed. Throughout the various views and illustrative embodiments, like reference numbers are used to designate like elements.

FIG. 1 to FIG. 10 illustrate partial cross sectional views of intermediate stages in the manufacturing of a semiconductor package according to some embodiments of the present disclosure. Referring to FIG. 1, in some embodiments, a carrier 160 is provided, and an adhesive layer 170 may be provided on the carrier 160. In some embodiments, the carrier 160 may be a glass carrier, a ceramic carrier, or the like. The adhesive layer 170 may be a die attach film (DAF), which may include an insulating adhesive material, for example. In some embodiments, the adhesive layer 170 is formed over the carrier 160, as shown in FIG. 1. The adhesive layer 170 may include a polymer and in some embodiments includes a thermoplastic material. The adhesive layer 170 may be liquid, e.g., a thick liquid, when applied but forms a solid at room temperature. The adhesive layer 170 may become semi-liquid when heated and may become sticky to function as an adhesive at elevated temperatures. The adhesive layer 170 may include a polymer-based film that functions as an adhesive when heated, in some embodiments, for example. In some embodiments, the adhesive layer 170 may include a thermoplastic material, such as epoxy resin, phenol resin, or poly-olefin, as examples, although alternatively, other thermoplastic materials or polymers compatible with semiconductor processing environments may be used. The adhesive layer 170 may be applied to the carrier 160 using a lamination process, for example. Alternatively, the adhesive layer 170 may be applied by other techniques and may include other suitable materials.

In some embodiments, an optional release film 165 may be formed over the carrier 160, and the adhesive layer 170 is formed over the release film 165. In some embodiments, the adhesive layer 170 may be formed over the release film 165 (e.g. by a process that rolls and attaches the adhesive layer 170 to the release film 165). The release film 165 may include a light to heat conversion (LTHC) or thermal release film, as examples, although alternatively, the release film 165 may include other materials. In an embodiment, the adhesive layer 170 may differ in composition from the release film 165. As an example, the adhesive layer 170 may be free from a LTHC material, which may prevent the adhesive layer 170 from deteriorating or decomposing when the release film 165 is exposed to light in an attempt to release the carrier 160 from the structures formed thereon.

In some embodiments, the carrier may include a device mounting region A1 where at least one semiconductor device is disposed and a peripheral region A2 surrounding the device mounting region A1. In some embodiments, a plurality of through vias (not shown) may be provided over the carrier 160 for electrical connection if needed, and the through vias may be disposed on the peripheral region A2 of the carrier 160 surrounding the device mounting region A1. It is noted that "central" and "peripheral" herein may not be interpreted literally but rather be deemed as spatially relative terms, which are intended to encompass different orientations of the device in use or operation in addition to the orientation depicted in the figures.

Figure 2:
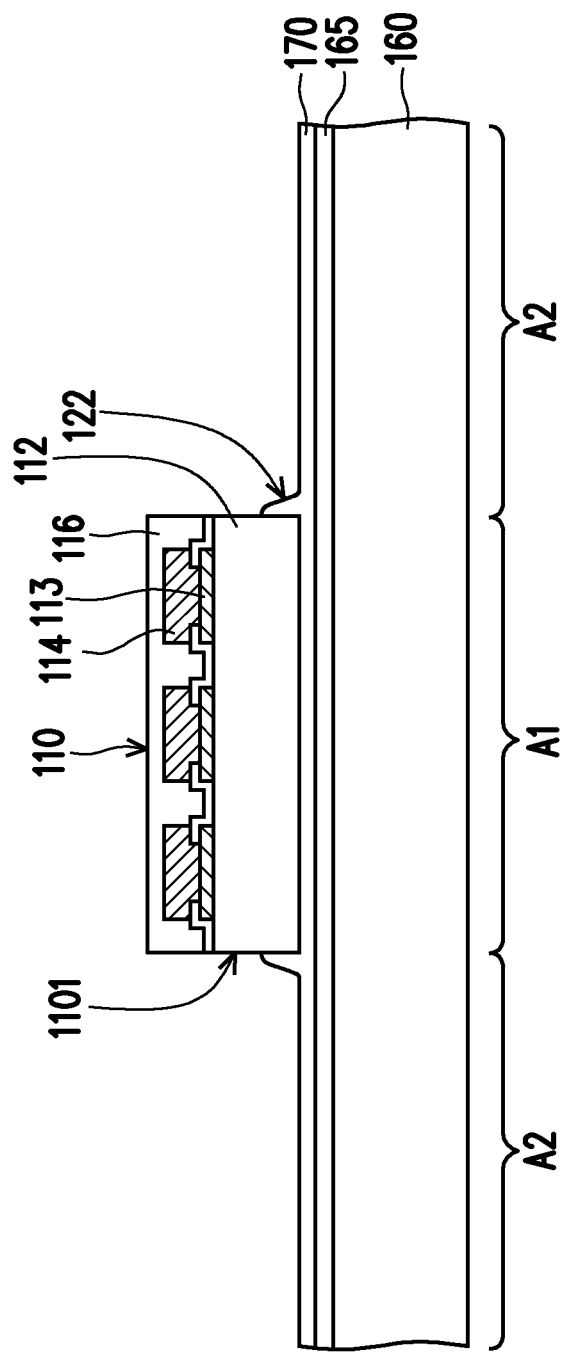

With now reference to FIG. 2, at least one semiconductor device 110 (one semiconductor device 110 is illustrated herein, but not limited thereto) is attached to the carrier 160 by the adhesive layer 170. To facilitate adhering the semiconductor device 110 to the carrier 160, heat can be applied to the adhesive layer 170, and/or pressure can be applied to the semiconductor device 110 and/or the adhesive layer 170, so that the adhesive layer 170 can be malleable (e.g., in a semi-fluid state). Accordingly, the adhesive layer 170 can mold itself around the semiconductor device 110 and forms a bond between the carrier 160 and the semiconductor device 110. That is, when the semiconductor device 110 is attached to the carrier 160, the adhesive layer 170 is extruded upward and covers a part of a side surface 1101 of the semiconductor device 110, such that there are substantially no gaps (e.g., voids, spaces, abscesses) between the adhesive layer 170, the semiconductor device 110 and the carrier 160. Furthermore, the adhesive layer 170 can be applied such that it can reduce or eliminate delamination between the semiconductor device 110 and the carrier 160.

Once the semiconductor device 110 is attached to the carrier 160, the heat and/or pressure can be removed to allow the adhesive layer 170 to cure (e.g., soft cure). Further curing can be performed as desired to facilitate the attachment of the semiconductor device 110 and the carrier 160. For example, soft curing can be performed such that the adhesive layer 170 is permitted to set for a period of time, as desired. Also, hard curing can be performed to heat the adhesive layer 170 at a desired temperature level for a desired period of time to complete the setting of the adhesive layer 170.

In some embodiments, at least one semiconductor device 110 as shown in FIG. 2 is provided over the carrier 160 and located within the device mounting region A1. In some embodiments, the semiconductor device 110 may include a logic chip including logic circuits therein. In some embodiments, multiple semiconductor devices 110 may be placed over carrier 160 and are device dies that are designed for mobile applications, and may include a Power Management Integrated Circuit (PMIC) die and a Transceiver (TRX) die, for example. Although one semiconductor device 110 is illustrated, more semiconductor devices may be placed over the carrier 160 and level with one another.

In some embodiments, a plurality of conductive vias 114 (such as copper vias) may be provided on an active surface (e.g. the top surface) of the semiconductor device 110 and electrically coupled to a plurality of pads 113 on a substrate 112 of the semiconductor device 110. In some embodiments, a dielectric layer 116 may be formed over the active surface (e.g. the top surface) of the semiconductor device 110, and may cover the top surfaces of the conductive vias 114. In other embodiments, the top surface of the dielectric layer 116 may be substantially level with the top surfaces of the conductive vias 114. Alternatively, the dielectric layer 116 may be omitted, and the conductive vias 114 protrude from the active surface of the semiconductor device 110.

Figure 3:
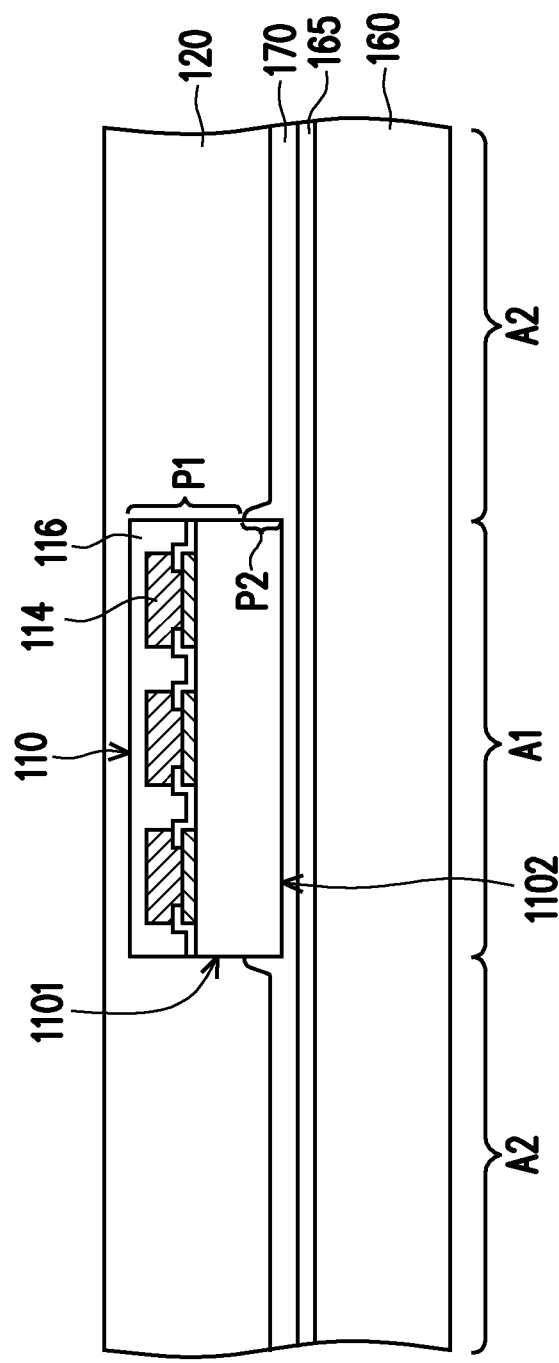

Then, referring to FIG. 3, the semiconductor device 110 on the carrier 160 is encapsulated by an encapsulating material 120. In other words, the encapsulating material 120 is provided over the carrier 160 to encapsulate the semiconductor device 110 at the device mounting region A1. In some embodiments, the encapsulating material 120 may include a molding compound, an epoxy, or a resin, etc. The encapsulating material 120 is in contact with the adhesive layer 170. In specific, the adhesive layer 170 covers a (second) part P2 of the side surface 1101 of the semiconductor device 110 while the encapsulating material 120 encapsulates the rest (a first part P1) of the side surface 1101 of the semiconductor device 110 that is not covered by the adhesive layer 170. Since the encapsulating material 120 covers adhesive layer 170 in a conformal manner, the encapsulating material 120 includes a groove 122 around the semiconductor device 110 at a (second) side of the encapsulating material 120 facing the carrier 160, and the adhesive layer 170 fills the groove 122. In some embodiments, a top surface of the encapsulating material 120 may be higher than the top surface of the semiconductor device 110. Namely, the encapsulating material 120 may cover the top surface of the semiconductor device 110.

Then, the encapsulating material 120 is cured using a curing process in some embodiments. The curing process may includes heating the encapsulating material 120 to a predetermined temperature for a predetermined period of time, using an anneal process or other heating process. The curing process may also include an ultra-violet (UV) light exposure process, an infrared (IR) energy exposure process, combinations thereof, or a combination thereof with a heating process. Alternatively, the encapsulating material 120 may be cured using other methods. In some embodiments, a curing process is not included. During the curing process, the encapsulating material 120 may shrink, and the adhesive layer 170 may rise up accordingly. As such, there is a height difference between the lower surface of the encapsulating material 120 and the back surface 1102 of the semiconductor device 110.

Figure 4:
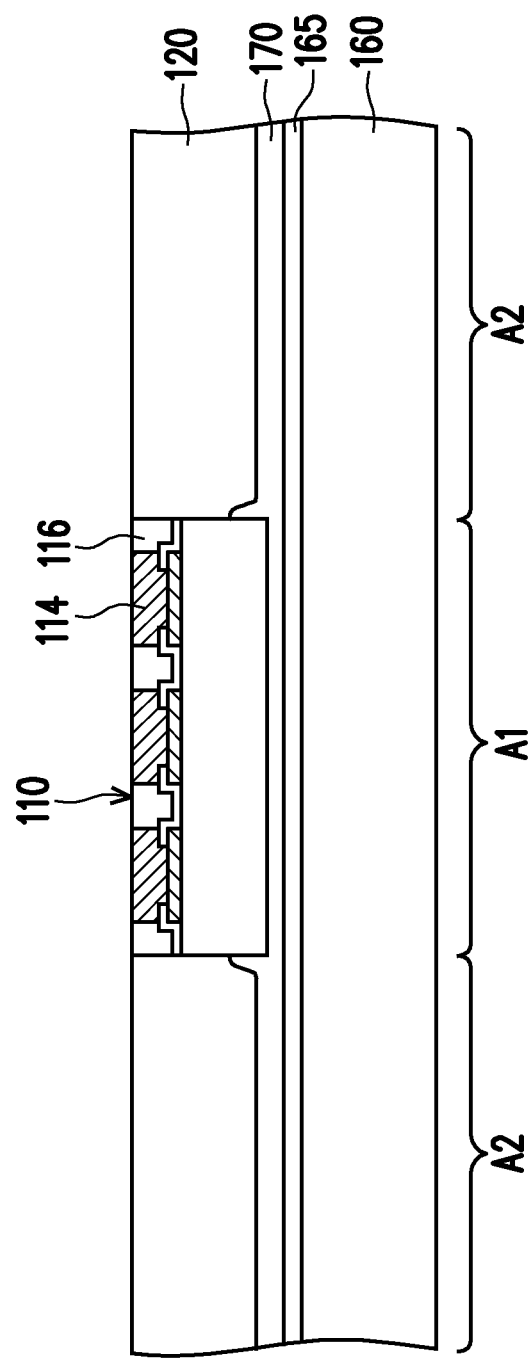

With now reference to FIG. 4, for the embodiment of the encapsulating material 120 covering the top surface of the semiconductor device 110*a*, a thinning process, such as a grinding process, may be performed to thin the encapsulating material 120 (and the dielectric layer 116) until the top surfaces of the conductive vias 114 are revealed. The resulting structure is shown in FIG. 4. Due to the thinning process, the upper surface of the encapsulating material 120 is substantially level with the top surfaces of the conductive vias 114, and the top surface of the dielectric layer 116. Throughout the description, the resultant structure including the semiconductor device 110 and the encapsulating material 120 (and a plurality of through vias extending through the encapsulating material 120, if applicable) as shown in FIG. 4 is referred to as an encapsulated semiconductor device 101, which may have a wafer form in the process. Accordingly, in the encapsulated semiconductor device 101, the semiconductor device 110 is disposed at the device mounting region A1 and the encapsulating material 120 encapsulates the first (upper) part of the side surface 1101 of the semiconductor device 110. In some embodiments, through vias (not shown) surrounding the semiconductor device 110 may extend through the encapsulating material 120.

Figure 5:
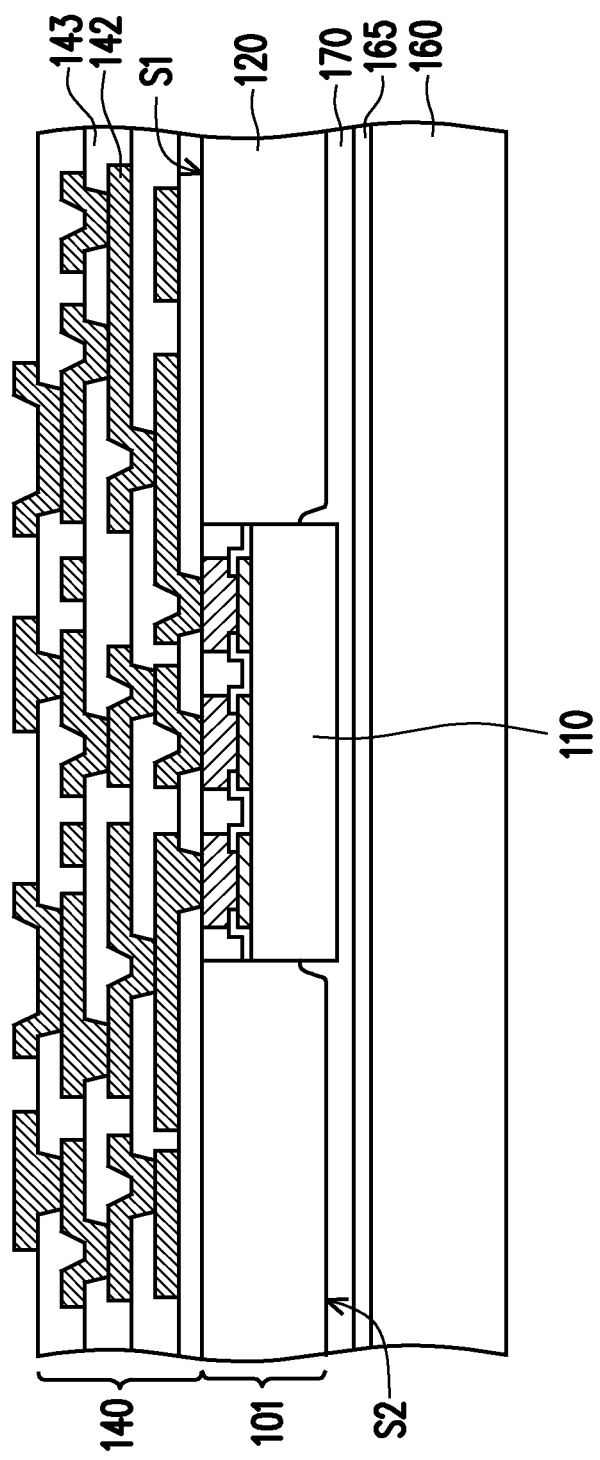

With now reference to FIG. 5, a redistribution structure 140 is provided over the semiconductor device 110 and a (first) side the encapsulating material 120 away from the carrier 160. The redistribution structure 140 is electrically connected to the semiconductor device 110 of the encapsulated semiconductor device 101. In some embodiments, the redistribution structure 140 are formed over the encapsulated semiconductor device 101 to connect to the conductive vias 114 of the semiconductor device 110 and the through vias (if applicable). In some embodiments, the redistribution structure 140 may also interconnect the conductive vias 114. The redistribution structure 140 may be formed by, for example, depositing conductive layers, patterning the conductive layers to form redistribution circuits 142, partially covering the redistribution circuits 142 and filling the gaps between the redistribution circuits 142 with dielectric layers 143, etc. The material of the redistribution circuits 142 may include a metal or a metal alloy including aluminum, copper, tungsten, and/or alloys thereof. The dielectric layers 143 may be formed of dielectric materials such as oxides, nitrides, carbides, carbon nitrides, combinations thereof, and/or multi-layers thereof. The redistribution circuits 142 are formed in the dielectric layers 143 and electrically connected to the first semiconductor device 110 and the through vias (if applicable). In addition, an Under Bump Metallurgy (UBM) layer 144 may be formed on the redistribution structure 140 by sputtering, evaporation, or electroless plating, etc.

Figure 6:
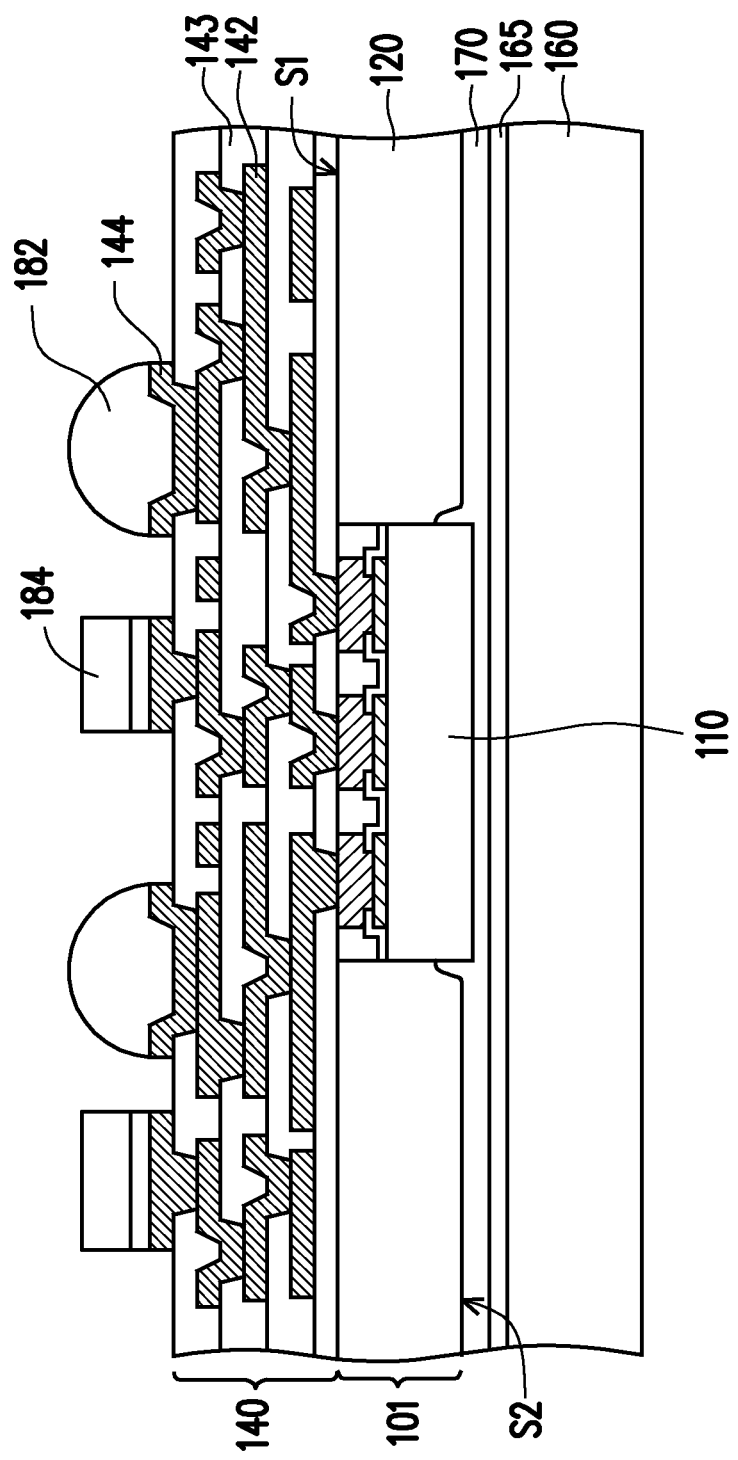

With now reference to FIG. 6, at least one of conductive bump 182 (two conductive bumps 182 are illustrated herein, but not limited thereto) is provided over the redistribution structure 140 in accordance with some embodiments. In some embodiments, at least one Integrated Passive Device (IPD) 184 (two IPDs 182 are illustrated herein, but not limited thereto) is also provided over the redistribution structure 140. The IPD 184 may be fabricated using standard wafer fabrication technologies such as thin film and photolithography processing, and may be mounted on the redistribution structure 140 through, for example, flip-chip bonding or wire bonding, etc.

The formation of the conductive bumps 182 may include placing solder balls on the UBM layer 144 (or on the redistribution structure 140), and then reflowing the solder balls. In alternative embodiments, the formation of the conductive bumps 182 may include performing a plating process to form solder regions on the UBM layer 144 (or on the redistribution structure 140), and then reflowing the solder regions. The conductive bumps 182 may also include conductive pillars, or conductive pillars with solder caps, which may also be formed through plating. For advanced packaging of semiconductor devices 110 with many function circuitries, the sizes of conductive bumps 182 may be relatively small to enable more bumps to connect to an input/output (I/O) of semiconductor devices 110. For example, the semiconductor devices 110 may be a logic chip, which needs a large number of I/O connections to achieve its functions. As a result, the conductive bumps 182 with fine pitches and sizes, such as micro-bumps, are used for external connections. Micro-bumps may include copper posts and may be called copper post (or pillar) bumps. In some embodiments, the conductive bumps 182 may also be C4 bumps. "C4" stands for controlled collapse chip connection. For example, the semiconductor devices 110 may be a chip with lower numbers of I/O connections (bumps), such as memory chips, and C4 bumps may be adopted. In general, C4 bumps has a solder layer thicker than the copper layer and is not a copper post bump. In contrast, micro bump is a copper post bump with copper layer being thicker than solder layer. However, the embodiments are merely for illustration purpose, and the disclosure is not limited thereto. At this point, a semiconductor package in wafer from (referred to "reconstructed semiconductor wafer" hereinafter) is substantially formed on the carrier 160.

Figure 7:
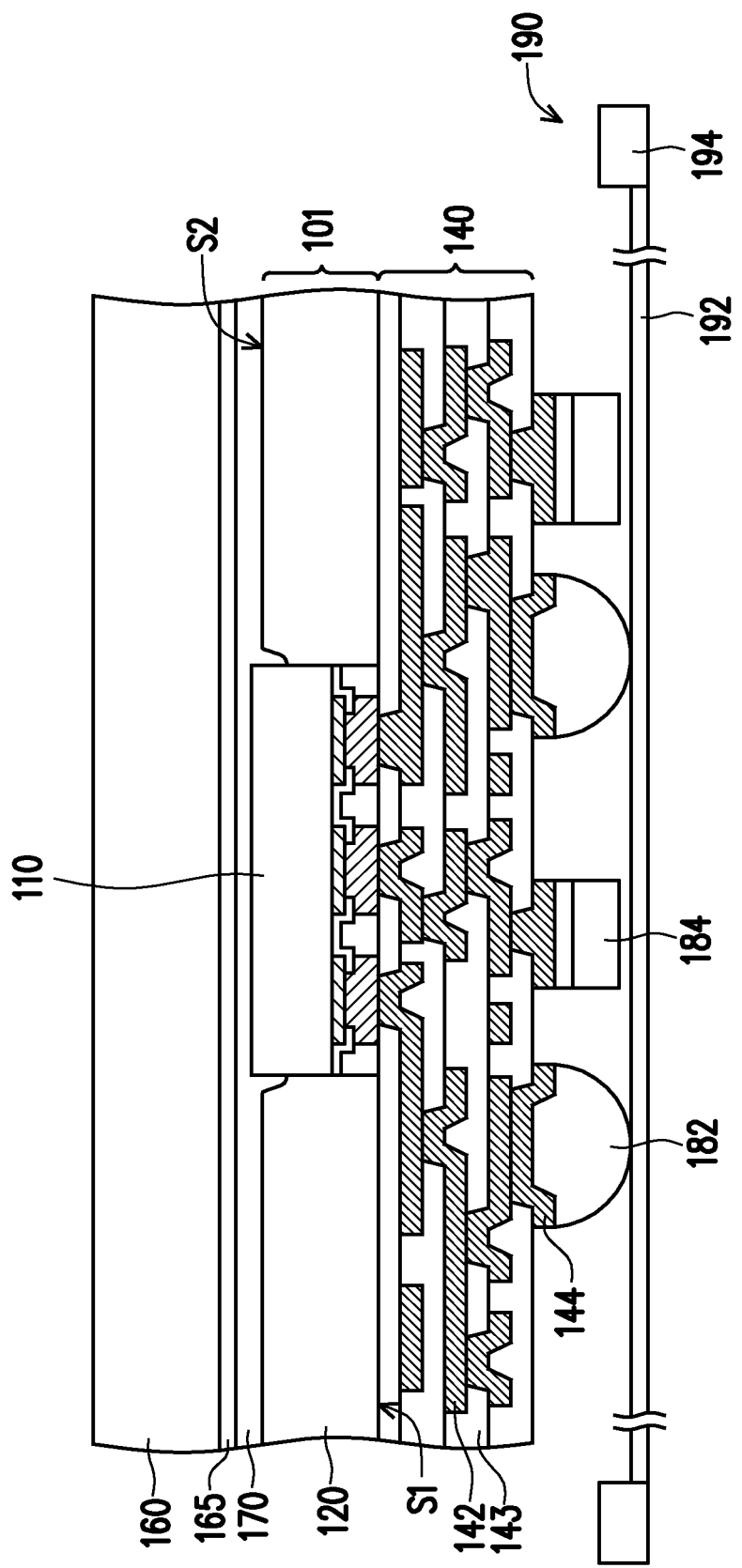

With now reference to FIG. 6 and FIG. 7, after the reconstructed semiconductor wafer shown in FIG. 6 is formed on the carrier 160, the reconstructed semiconductor wafer with the carrier 160 may be flipped over and mounted on a tape carrier 190 with the conductive bumps 182 facing the tape carrier 190. The tape carrier 190 bearing the reconstructed semiconductor wafer with the carrier 160 may further include a tape structure 192 for temporarily fixing the conductive bumps 182 to the tape carrier 190, and a frame structure 194, which may be a metal ring intended to provide support and stability for the structure during the sequential process. In some embodiments, the tape structure 192 of the tape carrier 190 may be made of, for example, polymer material with flexibility. Accordingly, when the conductive bumps 182 are attached to the tape carrier 190, the tape structure 192 of the tape carrier 190 may be deformed and embraces at least a lower portion of each of the conductive bumps 182. In some embodiments, the tape carrier 190 is a dicing tape.

Figure 8:
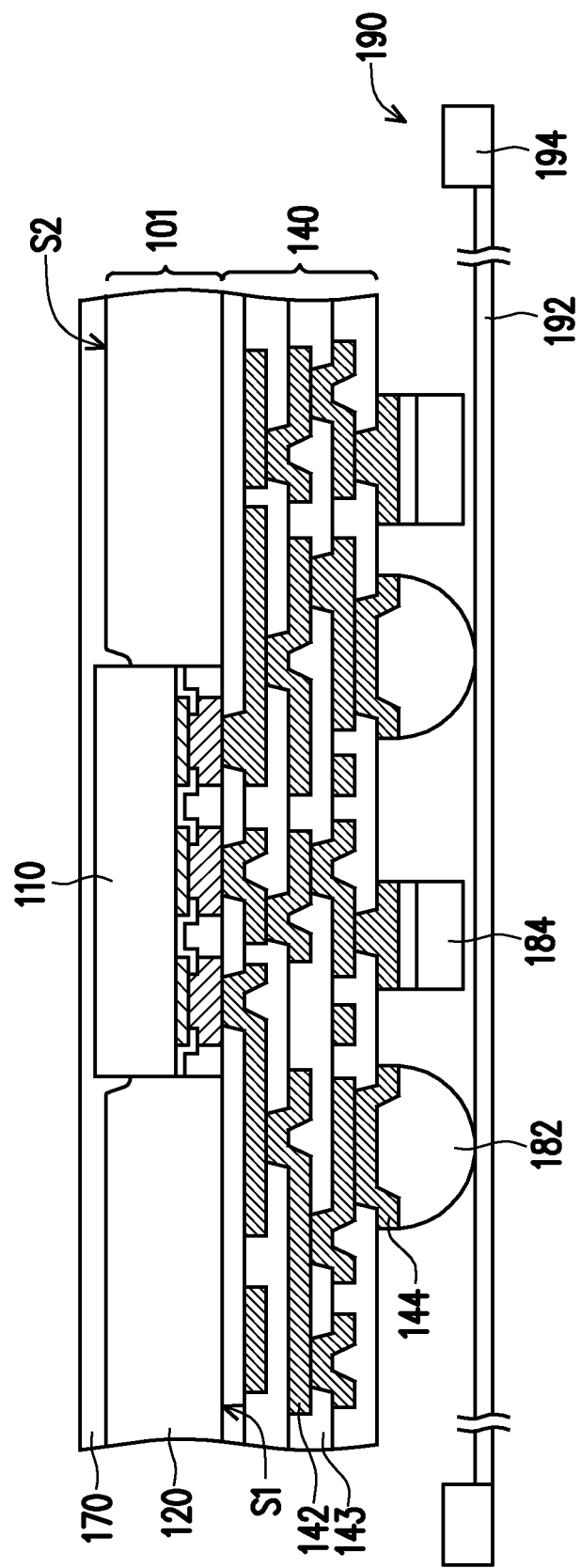

With reference now to FIG. 7 and FIG. 8, the carrier 160 is removed from the reconstructed semiconductor wafer on the tape carrier 190 and reveals the adhesive layer 170 underneath. The carrier 160 may be de-bonded using, for example, a thermal process to alter (decomposing) the adhesive properties of the release film 165. In an embodiment, an energy source such as an ultraviolet (UV) laser, a carbon dioxide (CO2) laser, or an infrared (IR) laser, is utilized to irradiate and heat the release film 165 until the release film 165 loses at least some of its adhesive properties. Once performed, the carrier 160 and the release film 165 may be physically separated and removed from the reconstructed semiconductor wafer. Since the adhesive layer 170 is free from the LTHC material, exposure to the heat of light does not decompose the release film 165. In other embodiments, a thermal de-bonding process or a laser de-bonding process may be utilized, depending upon the precise adhesive chosen for the release film 165.

Figure 9:
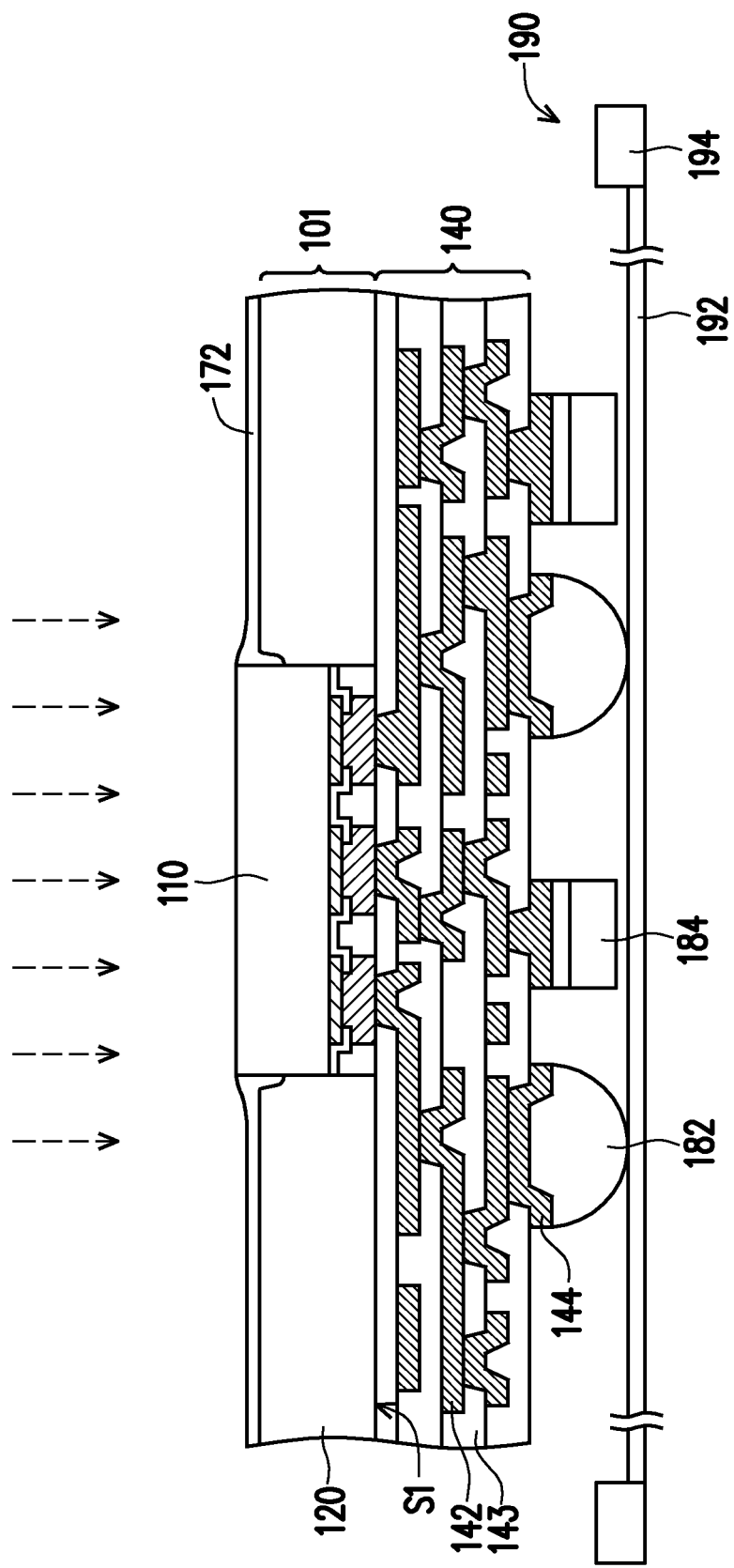
Figure 11:
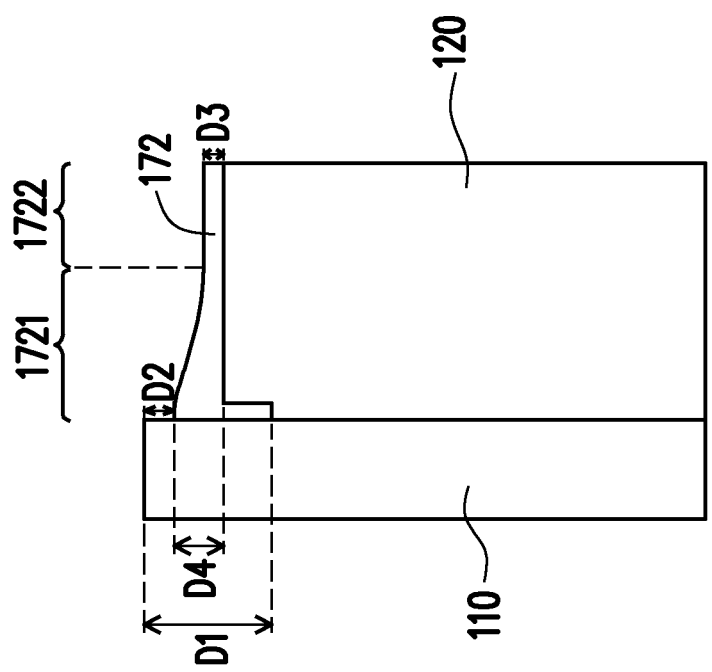
FIG. 11 illustrates a partial enlarged view of a semiconductor package according to some embodiments of the present disclosure.

FIG. 11 illustrates a partial enlarged view of a semiconductor package according to some embodiments of the present disclosure. With now reference to FIG. 9 and FIG. 11, in some embodiments, the adhesive layer 170 is partially removed by anisotropic etching process to reveal the back surface 1102 of the semiconductor device 110 and form an adhesive residue 172 as it is shown in FIG. 9. The anisotropic etching process is performed while reconstructed semiconductor wafer (including the encapsulated semiconductor device 101) is on the tape carrier 190. In some embodiments, the anisotropic etching process includes a dry etching process, which generally refers to the removal of material by exposing the material to a bombardment of ions that dislodge portions of the material from the exposed surface. The ions usually refers to a plasma of reactive gases such as fluorocarbons, oxygen, chlorine, boron trichloride; sometimes with addition of nitrogen, argon, helium and other gases. In one of the implementations, the dry etching process is a reactive-ion etching (RIE) process, which uses chemically reactive plasma to remove material (e.g., adhesive layer 170) on wafer. For example, the RIE process is performed with an RF power in a range of 500 to 1000 Watts. Unlike with the wet chemical etchants used in wet etching, the dry etching process typically etches directionally or anisotropically. Therefore, by using anisotropic etching process to partially remove the adhesive layer 170, anisotropic etching merely etch in a single direction (e.g., vertical direction), instead of etching in multiple directions within the reconstructed semiconductor wafer. As such, the adhesive layer 170 would not result in undercutting of etching areas along the horizontal direction.

As a result, in a structural perspective, the adhesive residue 172 as it is shown in FIG. 9 and FIG. 11 is located over a (second) side of the encapsulating material 120 opposite to the (first) side where the redistribution structure 140 is disposed, and surrounds the semiconductor device 110. The adhesive residue 172 at least reveals a back surface 1102 of the semiconductor device 110 and encapsulates a part of the side surface 1101 of the semiconductor device 110. In some embodiments, the adhesive residue 172 at least partially covers the encapsulating material 120. An upper surface of the adhesive residue 172 is a rough surface due to the anisotropic etching process.

Since the anisotropic etching would not result in undercutting of the adhesive layer 170 along the horizontal direction, the adhesive residue 172 would have a continuous surface for filling and connecting the discontinuous surface (step) between the back surface 1101 of the semiconductor device 110 and the encapsulating material 120. In detail, referring to FIG. 11, in some embodiments, the adhesive residue 172 may include a central portion 1721, which is closer to the semiconductor device 110 and a peripheral portion 1722, which surrounds the central portion 1721 and is further away from the semiconductor device 110. As such, a thickness of the adhesive residue 172 gradually decreases from the central portion 1721 toward the peripheral portion 1722. In some embodiments, a maximum thickness (D1-D2) of the central portion 1721 is substantially greater than a maximum thickness D3 of the peripheral portion 1722. In some embodiments, the thickness of the adhesive residue 172 in the central portion 1721 gradually varies (decreases) while the thickness of the adhesive residue 172 in the peripheral portion 1722 may be substantially constant, but the disclosure is not limited thereto. It is noted that "central" and "peripheral" herein may not be interpreted literally but rather be deemed as spatially relative terms, which are intended to encompass different orientations of the device in use or operation in addition to the orientation depicted in the figures.

In some embodiment, a shortest distance D2 between the back surface 1102 of the semiconductor device 110 and an uppermost surface of the adhesive residue 172 is substantially equal to or smaller than 5 μm. That is, the step height (if any) between the back surface 1102 of the semiconductor device 110 and the uppermost surface of the adhesive residue 172 is slight. In other words, the conjunction between the semiconductor device 110 and the adhesive residue 172 is rather even and smooth, which can avoid or at least reduce die crack and/or delamination issues at die edges when external force is applied. Therefore, by partially removing the adhesive layer by anisotropic etching process, a subsequent planarizing process for grinding the backside of the reconstructed semiconductor wafer can be omitted.

For other structure characteristics of the resultant structure, for example, a width D5 of the central portion 1721, where the thickness of the adhesive residue 172 gradually varies, ranges between 100 μm to 150 μm. A vertical distance D1 between the back surface 1102 of the semiconductor device 110 and bottom of the groove 122 (caused by extrusion of the adhesive layer 170 when placing the semiconductor device 110) ranges between 10 μm to 30 μm. A vertical distance D3 between the uppermost surface of the adhesive residue 172 and an upper surface of the encapsulating material 120 ranges between 5 μm to 20 μm. A thickness of the adhesive residue 172 in the peripheral portion 1722 ranges between 3 μm to 10 μm. The disclosure is not limited thereto.

Figure 10:
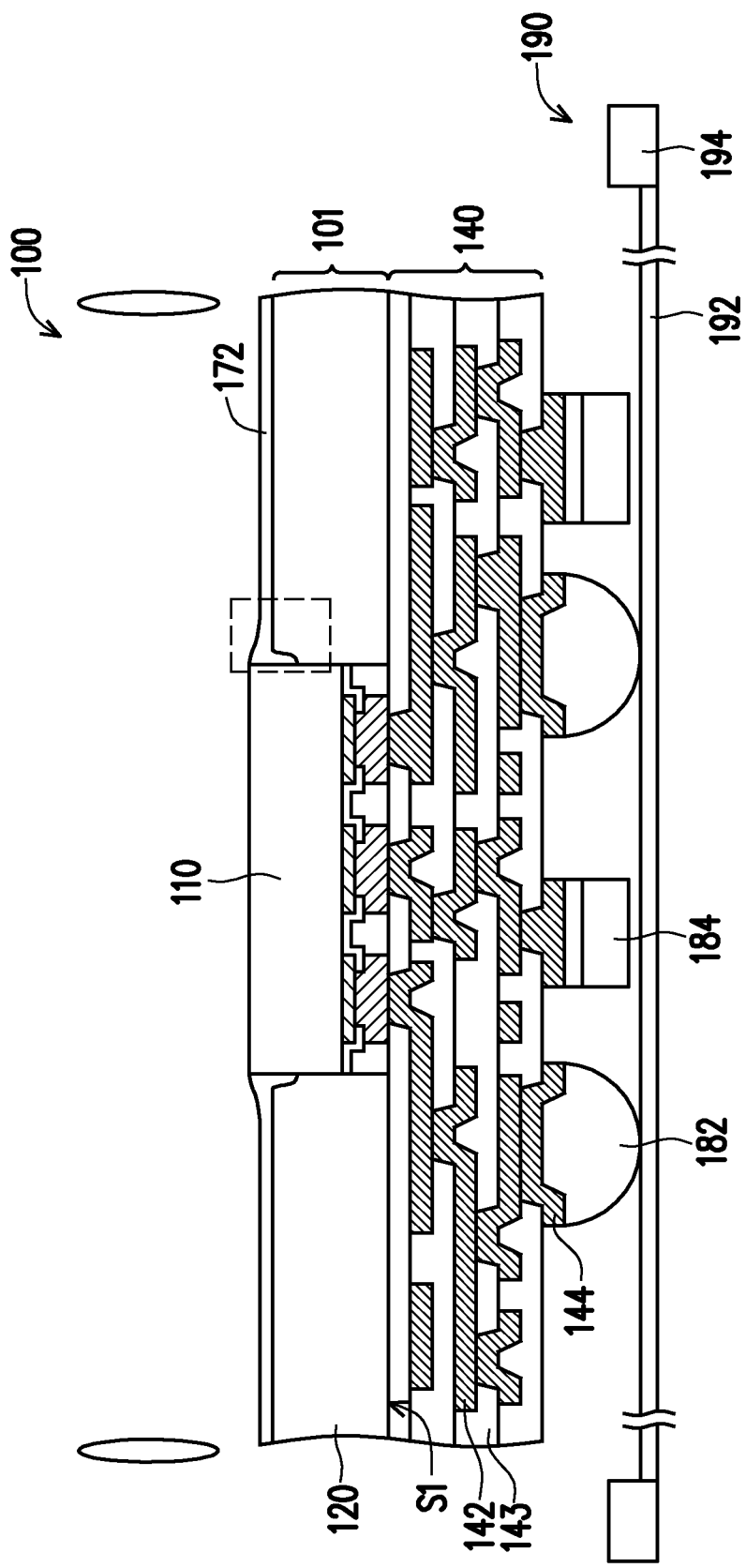

With now reference to FIG. 10, then, a singularization process is performed over the reconstructed semiconductor wafer (including encapsulated semiconductor device 101) on the tape carrier 190 to form a plurality of semiconductor packages 100. In other words, the resultant structure shown in FIG. 9 may be singulated or diced (e.g. along dicing line), thereby forming a plurality of semiconductor packages 100, each of which may be substantially identical to the semiconductor package 100 shown in FIG. 10.

With such configuration, by using anisotropic etching process to partially remove the adhesive layer, the process can be performed on the same tape carrier 190 for subsequent singularization process instead of performed on a chuck table. Accordingly, there is no need to go through the complex processes such as attaching the wafer onto the chuck table with backside grinding tape (BG tape) to remove the adhesive layer by wet etching process, grinding the backside of the wafer, flipping it over to clean the BG tape, and then mounted it onto the tape carrier for dicing process. Therefore, the manufacturing process can thereby be simplified and the production cost can be reduced.

Figure 12:
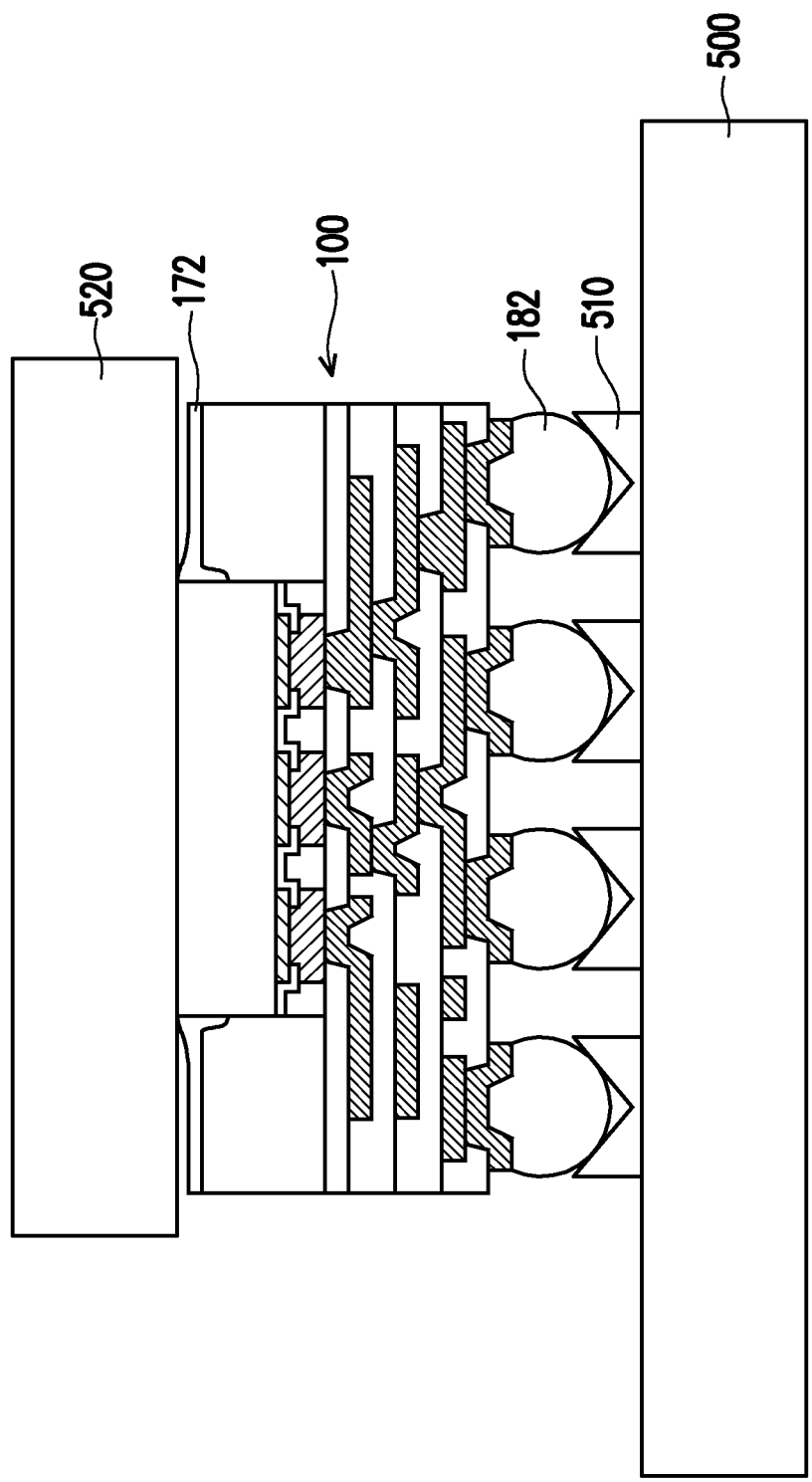
FIG. 12 illustrates a schematic view of a semiconductor package on testing apparatus according to some embodiments of the present disclosure.

FIG. 12 illustrates a schematic view of a semiconductor package on testing apparatus according to some embodiments of the present disclosure. With now reference to FIG. 12, the semiconductor package 100 need to be tested to verify the quality, and the functional testing of the semiconductor package 100 may be performed by using testing apparatus 500 shown in FIG. 12 to probe the conductive bumps 182 on the surfaces of package. The functional test may be performed through socket, which includes a plurality of probe pins 510 pushed against the conductive bumps 182. Through probe pins 510, input signals may be fed into the semiconductor package 100, and output signals may be retrieved from semiconductor package 100. When the conductive bumps 182 are probed by pins 510 of the testing apparatus 500 to test the structure, an external force may be applied by the lid 520 of the testing apparatus 500 toward the pins 510. If the semiconductor package has a steep step between the semiconductor device 110 and the encapsulating material 120, stress concentration would occur at the die edges, which may lead to die crack and/or delamination issues at die edges. Therefore, by using anisotropic etching process to partially remove the adhesive layer, the adhesive residue 172 would have a continuous surface for filling and connecting the discontinuous interface (step) between the back surface 1102 of the semiconductor device 110 and the encapsulating material 120. That is, instead of having a steep step between the semiconductor device 110 and the encapsulating material 120, the back surface of the semiconductor package 100 has a very gentle slope, which can avoid or at least reduce die crack and/or delamination issues at die edges when external force is applied during the testing process. Therefore, a planarizing process for grinding the backside of semiconductor package 100 can be omitted, which can further simplifies the manufacturing process and reduces the production cost without die crack and/or delamination issues.

Figure 13:
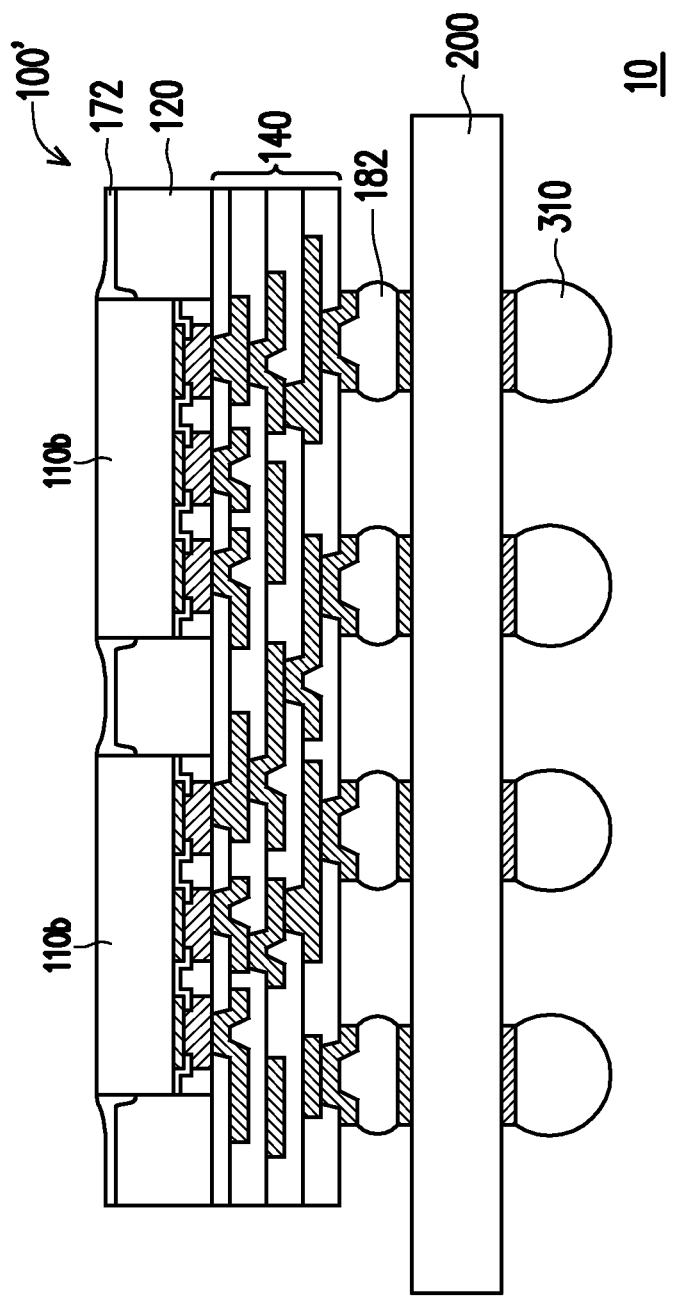
FIG. 13 illustrates a cross sectional view of a semiconductor package according to some embodiments of the present disclosure.

FIG. 13 illustrates a cross sectional view of a semiconductor package according to some embodiments of the present disclosure. It is noted that the semiconductor package 100' shown in FIG. 13 contains many features same as or similar to the semiconductor package 100 disclosed in previous embodiments except the semiconductor package 100' including more than one semiconductor devices 110a, 110b. The disclosure does not limit the quantity of the semiconductor devices. For purpose of clarity and simplicity, detail description of same or similar features may be omitted, and the same or similar reference numbers denote the same or like components.

With now reference to FIG. 13, in some embodiments, the semiconductor package 100' may be bonded to a substrate 200 such as a printed circuit board (PCB), a package, die, an interposer, a carrier or other structures that provides connectivity and/or functionality to the semiconductor package 100'. The substrate 200 may further include external connections 210, which may be contact bumps such as ball grid array bumps, microbumps, or controlled collapse chip connection (C4) bumps and may include a material such as tin, or other suitable materials, such as silver or copper. In an embodiment in which the external connections 210 are, for example, tin solder bumps, the external connections 210 may be formed by initially forming a layer of tin through any suitable method such as evaporation, electroplating, printing, solder transfer, ball placement, etc. Once a layer of tin has been formed on the structure, a reflow is performed in order to shape the material into the desired bump shapes. The external connections 210 may in turn be connected to another substrate (not shown).

Figure 14:
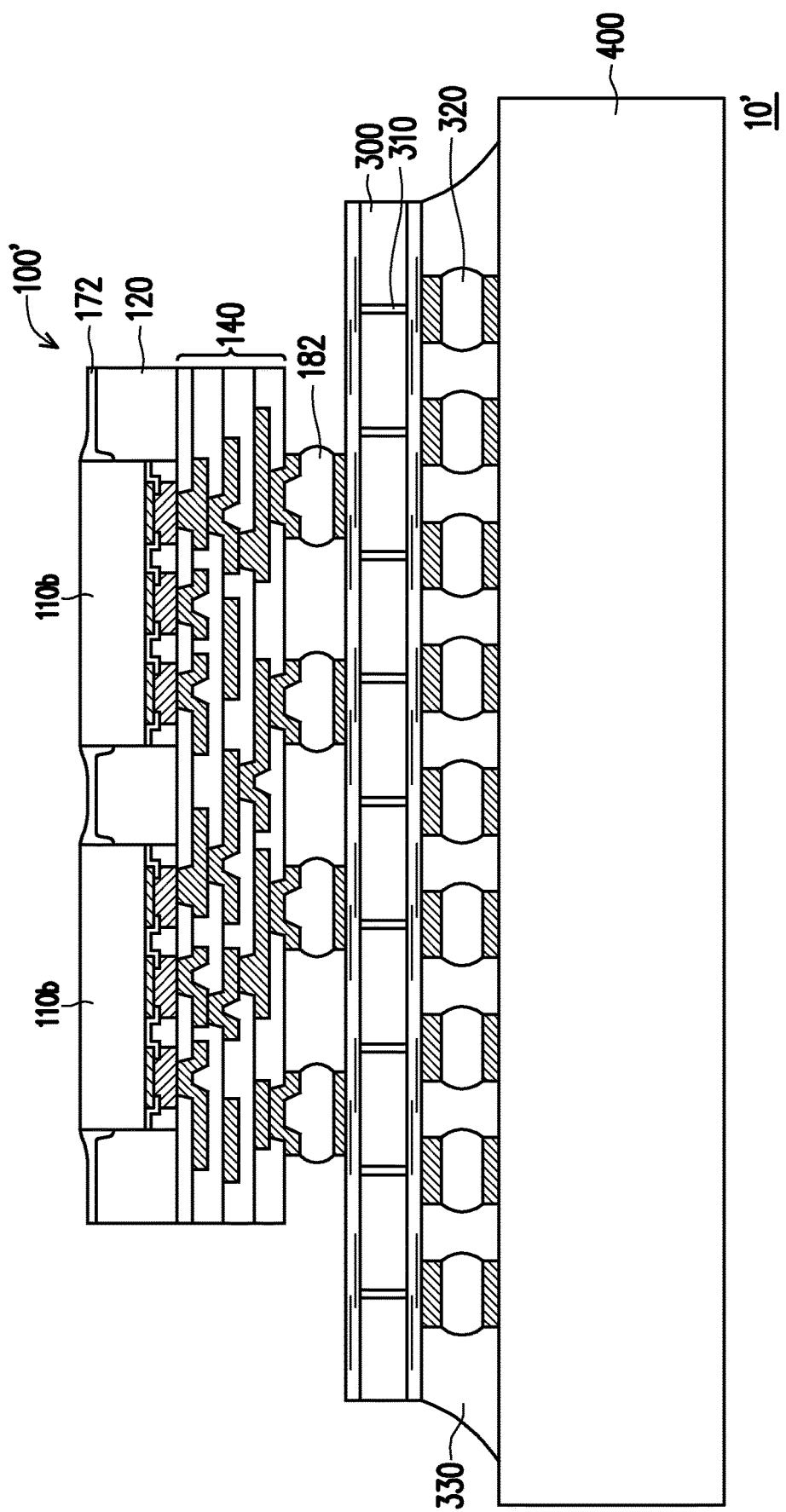
FIG. 14 illustrates a cross sectional view of a semiconductor package according to some embodiments of the present disclosure.

FIG. 14 illustrates a cross sectional view of a semiconductor package according to some embodiments of the present disclosure. It is noted that the package 10a shown in FIG. 14 contains many features same as or similar to the packages 100, 10 disclosed in previous embodiments. The disclosure does not limit the quantity of the semiconductor devices. For purpose of clarity and simplicity, detail description of same or similar features may be omitted, and the same or similar reference numbers denote the same or like components. The main differences between the package 10a shown in FIG. 14 and the package 10 disclosed in previous embodiments are described as follows.

With now reference to FIG. 14, in some embodiments, the semiconductor package 100' may be bonded to a first side of an interposer 300 through the conductive bumps 182. In the present embodiment, the conductive bumps 182 may include, for example, micro bumps. The interposer 300 is further bonded to a substrate 400, which may be, for example, a packaging substrate, another die/wafer, a PCB, a high-density interconnect, or the like. Through substrate vias (TSVs) 310 extending through the interposer 300 provide an electrical connection between the conductive bumps 182 of the semiconductor package 100 and conductive balls 320 of the interposer 300, which may in turn be connected to the substrate 400.

Figure 15:
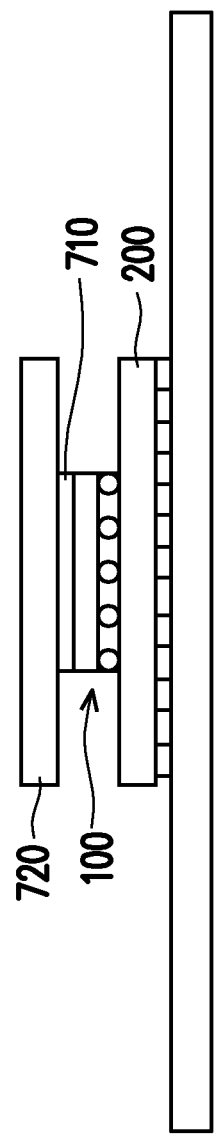
FIG. 15 illustrates a cross sectional view of a semiconductor package according to some embodiments of the present disclosure.

FIG. 15 illustrates a cross sectional view of a semiconductor package according to some embodiments of the present disclosure. It is noted that the package 10b shown in FIG. 15 contains many features same as or similar to the packages 100, 10, 10a disclosed in previous embodiments. For purpose of clarity and simplicity, detail description of same or similar features may be omitted, and the same or similar reference numbers denote the same or like components. The main differences between the package 10b shown in FIG. 15 and the packages disclosed in previous embodiments are described as follows.

With now reference to FIG. 15, in some embodiments, a (first) heat dissipation component 720 may further be disposed over the backside of the semiconductor package 100 (including the back surface 1102 of the semiconductor device 110 and the adhesive residue 172 shown in FIG. 10) through a (first) thermal interface material 710. That is, the front side of the semiconductor package 100 may be bonded to other suitable devices through the conductive bumps 182 as shown in FIG. 13 and FIG. 14, and the backside of the semiconductor package 100 may be bonded with the heat dissipation component 720 through thermal interface material 710. Since the adhesive residue provides the semiconductor package 100 with a rather even backside profile while revealing of the back surface of the semiconductor device, the semiconductor package 100 can be thermally coupled to the heat dissipation component 720 for heat dissipation. In some embodiments, the heat dissipation component 720 is a heat spreader, for example.

Figure 16:
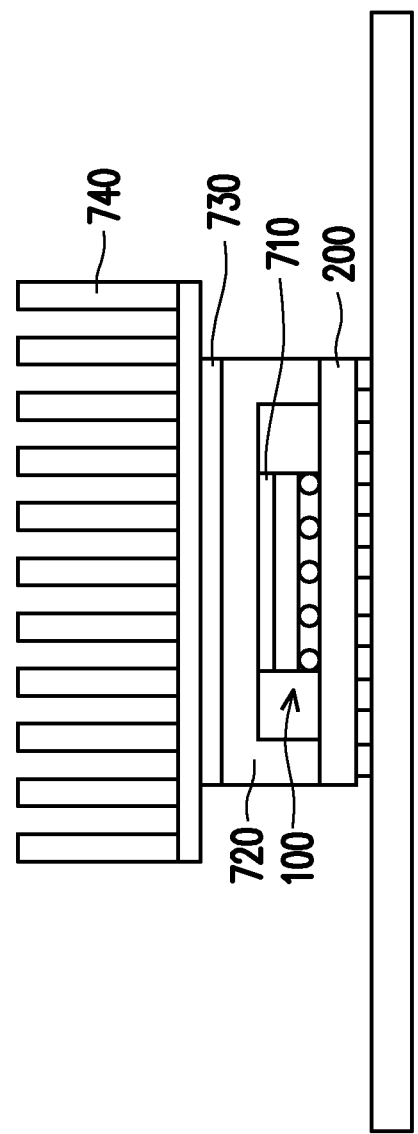
FIG. 16 illustrates a cross sectional view of a semiconductor package according to some embodiments of the present disclosure.

FIG. 16 illustrates a cross sectional view of a semiconductor package according to some embodiments of the present disclosure. It is noted that the package 10c shown in FIG. 16 contains many features same as or similar to the packages 100, 10, 10a, 10b disclosed in previous embodiments. For purpose of clarity and simplicity, detail description of same or similar features may be omitted, and the same or similar reference numbers denote the same or like components. The main differences between the package 10c shown in FIG. 16 and the packages disclosed in previous embodiments are described as follows.

With now reference to FIG. 16, in some embodiments, a (second) heat dissipation component 740 may further be disposed over the (first) heat dissipation component 740 through a (second) thermal interface material 730. In some embodiments, the front side of the semiconductor package 100 may be bonded to other suitable devices through the conductive bumps 182 as it is shown in FIG. 13 and FIG. 14, and the backside of the semiconductor package 100 may be bonded with the heat dissipation components 720, 740 through thermal interface materials 710, 730 respectively. Since the adhesive residue 172 provides the backside of the semiconductor package 100 with a rather even backside profile while revealing of the back surface of the semiconductor device, the semiconductor package 100 can be thermally coupled to the heat dissipation components 720, 740 for heat dissipation. In some embodiments, the heat dissipation component 740 is a heat sink, for example.

Based on the above discussions, it can be seen that the present disclosure offers various advantages. It is understood, however, that not all advantages are necessarily discussed herein, and other embodiments may offer different advantages, and that no particular advantage is required for all embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor package includes a semiconductor device, an encapsulating material, a redistribution structure, and an adhesive residue. The encapsulating material encapsulates a first part of a side surface of the semiconductor device. The redistribution structure is disposed over the semiconductor device and a first side of the encapsulating material. The adhesive residue is disposed over a second side of the encapsulating material opposite to the first side and surrounding the semiconductor device, wherein the adhesive residue encapsulates a second part of the side surface of the semiconductor device.

In accordance with some embodiments of the disclosure, a manufacturing method of a semiconductor package includes the following steps. A semiconductor device is attached to a carrier by an adhesive layer on the carrier. The semiconductor device is encapsulated by an encapsulating material. A redistribution structure is provided over the semiconductor device and the encapsulating material. The carrier is removed. The adhesive layer is partially removed by anisotropic etching process to form an adhesive residue, wherein the adhesive residue at least reveals a back surface of the semiconductor device and at least partially covers the encapsulating material.

In accordance with some embodiments of the disclosure, a manufacturing method of a semiconductor package includes the following steps. An encapsulated semiconductor device is provided over a carrier, wherein an adhesive layer is provided on the carrier. A redistribution structure is provided over the encapsulated semiconductor device. A plurality of conductive bumps are provided over the redistribution structure. The encapsulated semiconductor device is mounted on a tape carrier with the plurality of conductive bumps facing the tape carrier. The carrier is removed. The adhesive layer is partially removed by anisotropic etching process to form an adhesive residue, wherein the adhesive residue at least reveals a semiconductor device of encapsulated semiconductor device and covers an encapsulating material of the encapsulated semiconductor device. A singularization process is performed over the encapsulated semiconductor device on the tape carrier to form a plurality of semiconductor packages.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a semiconductor device;
   an encapsulating material encapsulating a first part of a side surface of the semiconductor device;
   a redistribution structure disposed over the semiconductor device and a first side of the encapsulating material; and
   an adhesive residue disposed over a second side of the encapsulating material opposite to the first side and surrounding the semiconductor device, wherein the adhesive residue encapsulates a second part of the side surface of the semiconductor device, wherein the adhesive residue is made of insulating adhesive material, reveals a back surface of the semiconductor device, the adhesive residue comprehensively covers and overlap with the second side of the encapsulating material, the adhesive residue comprises a central portion closer to the semiconductor device and a peripheral portion surrounding the central portion, and a maximum thickness of the central portion is greater than a maximum thickness of the peripheral portion.

2. The semiconductor package as claimed in claim 1, wherein a thickness of the adhesive residue gradually decreases from the central portion closer to the semiconductor device toward the peripheral portion away from the semiconductor device.

3. The semiconductor package as claimed in claim 1, wherein the encapsulating material comprises a groove on the second side and around the semiconductor device.

4. The semiconductor package as claimed in claim 3, wherein the adhesive residue fills the groove.

5. The semiconductor package as claimed in claim 1, wherein the adhesive residue is a die attach film, and an outer edge of the adhesive residue is aligned with an outer edge of the encapsulating material.

6. The semiconductor package as claimed in claim 1, wherein a shortest distance between the back surface of the semiconductor device and an uppermost surface of the adhesive residue is equal to or smaller than 5 μm.

7. The semiconductor package as claimed in claim 1, further comprising a heat dissipation component disposed over the back surface of the semiconductor device and the adhesive residue through a thermal interface material.

8. The semiconductor package as claimed in claim 1, wherein an upper surface of the adhesive residue is a rough surface.

9. The semiconductor package as claimed in claim 1, wherein the adhesive residue comprises a die attach film and comprises polymer and/or thermoplastic material.

10. The semiconductor package as claimed in claim 1, wherein a vertical side surface of the adhesive residue is aligned with a vertical side surface of the encapsulating material.

11. A semiconductor package, comprising:
    a semiconductor device;
    an encapsulating material laterally encapsulating the semiconductor device;
    a redistribution structure disposed over the semiconductor device and a first side of the encapsulating material; and
    an adhesive residue covering a second side of the encapsulating material opposite to the first side and surrounding the semiconductor device, wherein the adhesive residue encapsulates a part of a side surface of the semiconductor device, reveals a back surface of the semiconductor device, comprehensively covers and in contact with a back surface of the encapsulating material, and a thickness of the adhesive residue gradually decreases from a central portion closer to the semiconductor device toward a peripheral portion away from the semiconductor device.

12. The semiconductor package as claimed in claim 11, wherein the adhesive residue comprises the central portion closer to the semiconductor device and the peripheral portion surrounding the central portion and in contact with the back surface of the encapsulating material, and a maximum thickness of the central portion is greater than a maximum thickness of the peripheral portion.

13. The semiconductor package as claimed in claim 11, wherein an outer edge of the adhesive residue is aligned with an outer edge of the encapsulating material.

14. The semiconductor package as claimed in claim 13, wherein the thickness of the central portion of the adhesive residue in contact with the semiconductor device is greater than a thickness of an edge portion of the adhesive residue being aligned with an outer edge of the encapsulating material.

15. The semiconductor package as claimed in claim 11, wherein an upper surface of the adhesive residue is a rough surface.

16. The semiconductor package as claimed in claim 11, wherein an upper surface of the adhesive residue comprises a protruding portion surrounding side surfaces of the semiconductor device.

17. A semiconductor package, comprising:
a semiconductor device;
an encapsulating material laterally encapsulating the semiconductor device, wherein a back surface of the semiconductor device is higher than an uppermost surface of the encapsulating material;
a redistribution structure disposed over the semiconductor device and a first side of the encapsulating material; and
an insulating adhesive residue covering a second side of the encapsulating material and in contact with a part of a side surface of the semiconductor device, wherein the insulating adhesive residue reveals the back surface of the semiconductor device, an uppermost surface of the adhesive residue is higher than the uppermost surface of the encapsulating material, and a thickness of a central portion of the insulating adhesive residue in contact with the semiconductor device is greater than a thickness of an edge portion of the insulating adhesive residue being aligned with an outer edge of the encapsulating material.

18. The semiconductor package as claimed in claim 17, wherein the edge portion of the insulating adhesive residue is aligned with the outer edge of the encapsulating material.

19. The semiconductor package as claimed in claim 17, wherein the encapsulating material comprises a groove on the second side and surrounding the semiconductor device, the adhesive residue fills the groove and in contact with the back surface of the encapsulating material.

20. The semiconductor package as claimed in claim 19, wherein a bottom surface of the groove is in contact with the side surface of the semiconductor device and lower than an upper surface of the encapsulating material.

* * * * *